United States Patent [19]

Rappoport

[11] Patent Number: 5,248,962
[45] Date of Patent: Sep. 28, 1993

[54] DISPLAY DRIVER PROVIDING POSITIVE OFF-STATES

[75] Inventor: Oren P. Rappoport, Miami, Fla.

[73] Assignee: Sony Corporation of America, Park Ridge, N.J.

[21] Appl. No.: 732,098

[22] Filed: Jul. 18, 1991

[51] Int. Cl.⁵ .............................................. G09G 3/20
[52] U.S. Cl. ........................................ 345/39; 345/46
[58] Field of Search ............... 340/753, 754, 762, 782, 340/722, 763, 766; 178/18, 19; 346/17, 18

[56] References Cited

U.S. PATENT DOCUMENTS

| | | | |
|---|---|---|---|
| 4,150,365 | 4/1979 | Natori et al. | 364/900 |
| 4,183,021 | 1/1980 | Gertner | 340/753 |
| 4,386,347 | 5/1981 | Cutler et al. | 340/712 |
| 4,398,265 | 8/1983 | Puhl et al. | 340/763 |
| 4,511,894 | 4/1985 | Johnston | 340/756 |
| 4,743,897 | 5/1988 | Perez | 340/762 |
| 5,055,840 | 10/1991 | Bartlett | 340/712 |

OTHER PUBLICATIONS

Hewlett-Packard Handbook, "101 Element Bar Graph Array", pp. 5-32 through 5-29, Jan. 1986.

Primary Examiner—Alvin E. Oberley
Assistant Examiner—Chanh Nguyen
Attorney, Agent, or Firm—Ronald P. Kananen

[57] ABSTRACT

The invention is directed to a display driver for a bar graph display comprising a multi-segment bar graph array. The driver controls the bar graph display to have an OFF-state associated with each ON-state in order to prevent ghost or phantom bars. Additionally, the driver is implemented without a microprocessor to avoid the need for shielding against radial frequency interference.

16 Claims, 4 Drawing Sheets

FIG. 3

| DECODER INPUTS (COUNTING SEQUENCE): | | | | | | | | DECODER OUTPUTS: | | | | | | | | | | |
|---|---|---|---|---|---|---|---|---|---|---|---|---|---|---|---|---|---|---|
| ENABLE | MSB | | | LSB | | DELAY | | | | | | | | | | | | |
| E | D | C | B | A | X | Y | /0 | /1 | /2 | /3 | /4 | /5 | /6 | /7 | /8 | /9 |
| 0 | 0 | 0 | 0 | 0 | 0 | 1 | 1 | 1 | 1 | 1 | 1 | 1 | 1 | 1 | 1 | 1 |
| 0 | 0 | 0 | 0 | 0 | 0 | 0 | 0 | 1 | 1 | 1 | 1 | 1 | 1 | 1 | 1 | 1 |
| 0 | 0 | 0 | 0 | 0 | 1 | 0 | 1 | 1 | 1 | 1 | 1 | 1 | 1 | 1 | 1 | 1 |
| 0 | 0 | 0 | 0 | 1 | 0 | 1 | 1 | 1 | 1 | 1 | 1 | 1 | 1 | 1 | 1 | 1 |
| 0 | 0 | 0 | 0 | 1 | 0 | 0 | 1 | 0 | 1 | 1 | 1 | 1 | 1 | 1 | 1 | 1 |
| 0 | 0 | 0 | 0 | 1 | 1 | 0 | 1 | 1 | 1 | 1 | 1 | 1 | 1 | 1 | 1 | 1 |
| 0 | 0 | 0 | 1 | 0 | 0 | 1 | 1 | 1 | 1 | 1 | 1 | 1 | 1 | 1 | 1 | 1 |
| 0 | 0 | 0 | 1 | 0 | 0 | 0 | 1 | 1 | 0 | 1 | 1 | 1 | 1 | 1 | 1 | 1 |
| 0 | 0 | 0 | 1 | 0 | 1 | 0 | 1 | 1 | 1 | 1 | 1 | 1 | 1 | 1 | 1 | 1 |
| 0 | 0 | 0 | 1 | 1 | 0 | 1 | 1 | 1 | 1 | 1 | 1 | 1 | 1 | 1 | 1 | 1 |
| 0 | 0 | 0 | 1 | 1 | 0 | 0 | 1 | 1 | 1 | 0 | 1 | 1 | 1 | 1 | 1 | 1 |
| 0 | 0 | 0 | 1 | 1 | 1 | 0 | 1 | 1 | 1 | 1 | 1 | 1 | 1 | 1 | 1 | 1 |
| 0 | 0 | 1 | 0 | 0 | 0 | 1 | 1 | 1 | 1 | 1 | 1 | 1 | 1 | 1 | 1 | 1 |
| 0 | 0 | 1 | 0 | 0 | 0 | 0 | 1 | 1 | 1 | 1 | 0 | 1 | 1 | 1 | 1 | 1 |
| 0 | 0 | 1 | 0 | 0 | 1 | 0 | 1 | 1 | 1 | 1 | 1 | 1 | 1 | 1 | 1 | 1 |
| 0 | 0 | 1 | 0 | 1 | 0 | 1 | 1 | 1 | 1 | 1 | 1 | 1 | 1 | 1 | 1 | 1 |
| 0 | 0 | 1 | 0 | 1 | 0 | 0 | 1 | 1 | 1 | 1 | 1 | 0 | 1 | 1 | 1 | 1 |
| 0 | 0 | 1 | 0 | 1 | 1 | 0 | 1 | 1 | 1 | 1 | 1 | 1 | 1 | 1 | 1 | 1 |
| 0 | 0 | 1 | 1 | 0 | 0 | 1 | 1 | 1 | 1 | 1 | 1 | 1 | 1 | 1 | 1 | 1 |
| 0 | 0 | 1 | 1 | 0 | 0 | 0 | 1 | 1 | 1 | 1 | 1 | 1 | 0 | 1 | 1 | 1 |
| 0 | 0 | 1 | 1 | 0 | 1 | 0 | 1 | 1 | 1 | 1 | 1 | 1 | 1 | 1 | 1 | 1 |
| 0 | 0 | 1 | 1 | 1 | 0 | 1 | 1 | 1 | 1 | 1 | 1 | 1 | 1 | 1 | 1 | 1 |
| 0 | 0 | 1 | 1 | 1 | 0 | 0 | 1 | 1 | 1 | 1 | 1 | 1 | 1 | 0 | 1 | 1 |
| 0 | 0 | 1 | 1 | 1 | 1 | 0 | 1 | 1 | 1 | 1 | 1 | 1 | 1 | 1 | 1 | 1 |
| 0 | 1 | 0 | 0 | 0 | 0 | 1 | 1 | 1 | 1 | 1 | 1 | 1 | 1 | 1 | 1 | 1 |
| 0 | 1 | 0 | 0 | 0 | 0 | 0 | 1 | 1 | 1 | 1 | 1 | 1 | 1 | 1 | 0 | 1 |
| 0 | 1 | 0 | 0 | 0 | 1 | 0 | 1 | 1 | 1 | 1 | 1 | 1 | 1 | 1 | 1 | 1 |
| 0 | 1 | 0 | 0 | 1 | 0 | 1 | 1 | 1 | 1 | 1 | 1 | 1 | 1 | 1 | 1 | 1 |
| 0 | 1 | 0 | 0 | 1 | 0 | 0 | 1 | 1 | 1 | 1 | 1 | 1 | 1 | 1 | 1 | 0 |
| 0 | 1 | 0 | 0 | 1 | 1 | 0 | 1 | 1 | 1 | 1 | 1 | 1 | 1 | 1 | 1 | 1 |
| 1 | X | X | X | X | X | X | 1 | 1 | 1 | 1 | 1 | 1 | 1 | 1 | 1 | 1 |

DISPLAY DRIVER PROVIDING POSITIVE OFF-STATES

FIELD OF THE INVENTION

The invention relates to a counting/decoding scheme for a multiplexed LED-array display driver usable for example, in the field of scanning-type displays.

BACKGROUND OF THE INVENTION

Prior art type display drivers such as those used with the Hewlett Packard HDSP-88XX Series of 101-element LED linear arrays (bar graphs) rely on standard TTL parts. To further explain, the HDSP-88XX is a 101 element bar graph array. The linear array is arranged as ten groups of ten LED elements plus one additional element. The ten elements of each group have common cathodes. Like elements in the ten groups have common anodes. The device is addressed via 22 single-in-line pins extending from the back side of the display. A major problem with this type of device is that in some cases, undesirable "ghosts" or "phantom bars" can occur on the display. These ghosts or phantom bars are due in part to the inefficient logic/timing schemes employed in the prior art. These errors, which are obviously undesirable, are due largely to the fact that in this, and other prior art display driver schemes, as one LED is being turned off another is being turned on at the same time.

To summarize, a drawback with the prior art is that there is no assurance that only one segment will be on at a time. This leads to the problems of "ghosts" or "phantom" bars.

Another problem with the prior art display drivers is that, typically, they are microprocessor driven. While microprocessor programmability may be desirable in some situations, their faster clocks (e.g., in the MHz range) introduce or increase the likelihood of radio frequency interference (RFI) which ca necessitate heavy shielding. This is also obviously undesirable.

SUMMARY OF THE INVENTION

In view of the foregoing deficiencies, it is an object of the present invention to overcome these and other drawbacks of the prior art.

Specifically, it is an object of the present invention to avoid ghost or phantom bars in a bargraph display.

It is a further object of the present invention to ensure that only one LED segment of a bargraph is on at a time.

It is a further object of the present invention to avoid use of a microprocessor for controlling a bargraph display.

It is a further object of the present invention to avoid RFI in a bargraph display to avoid the need for shielding.

In order to overcome these and other drawbacks of the prior art, the present invention ensures that only one LED segment of a bargraph display is on at a given time. According to one embodiment, this is done by controlling the timing sequence which controls the height of the bar. In order to achieve this desired result, there may be provided a counter which generates two clock signals, e.g., a source clock and a sink clock. According to a preferred embodiment of the present invention, the source clock runs ten times faster than the sink clock. Additionally, there is preferably a delay clock which may be a count to three delay clock.

In operation, if an LED segment is turned on, the circuitry of the present invention, including the delay clock, ensures that there is an OFF state associated with each ON state. This is in contradistinction to the prior art such as the Hewlett Packard type system, where one turns ON as the previous one is turning OFF.

In a preferred embodiment of the present invention, PAL logic is used. The specific logic used, preferably in one or more PALs, is one of the novel aspects of the present invention.

Moreover, the present invention avoids the use of a microprocessor which overcome the drawbacks of RFI discussed above and the need for shielding against such interference.

BRIEF DESCRIPTION OF THE DRAWINGS

FIG. 3 is a chart representing a counting/decoding sequence according to one embodiment of the present invention.

DETAILED DESCRIPTION OF THE PREFERRED EMBODIMENT

Figure 1:
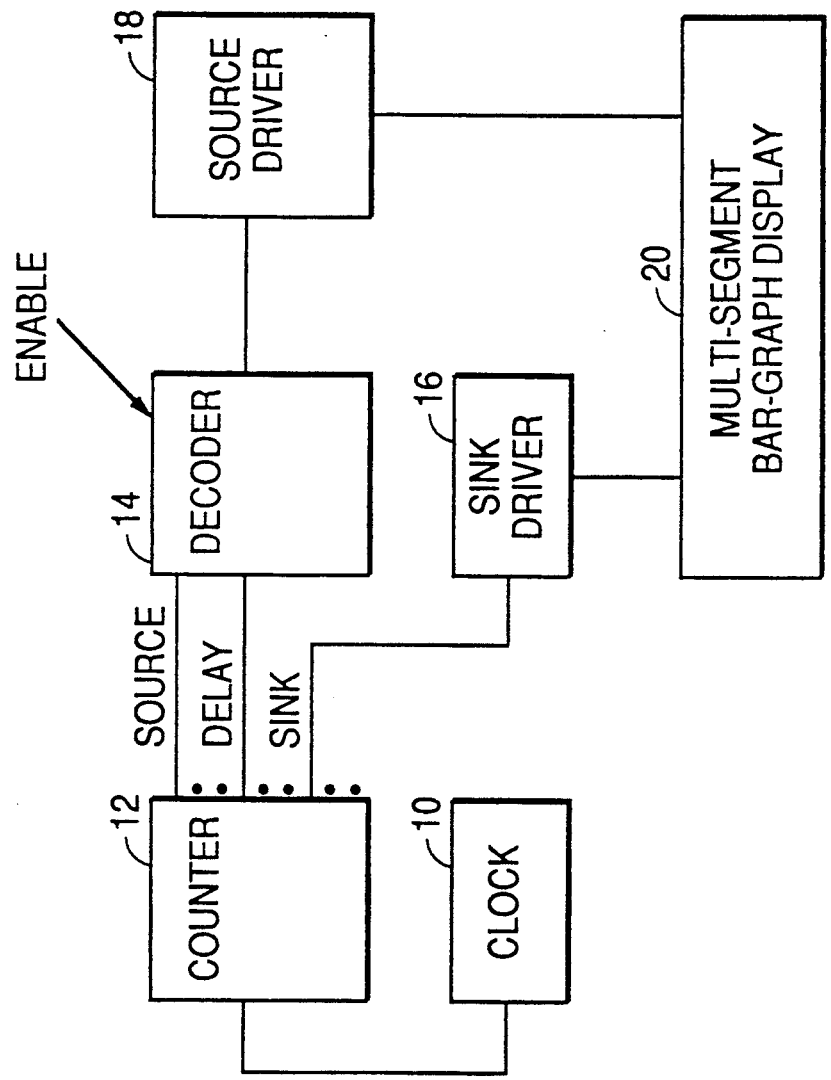
FIG. 1 is a block diagram illustrating one embodiment of the present invention.

With reference to FIG. 1, there is shown a circuit which may be used to implement the preferred embodiment. Specifically, in FIG. 1 there is shown a clock 10 which is connected to a counter 12. The counter 12 may be implemented by a PAL 20RA10, for example. The clock 10 may have multiple lines of outputs. In general, however, the output of the counter 12 comprises a source clock, a delay clock and a sink clock. This combination and its function is believed to be a novel aspect of the present invention.

In operation, an output of the counter 12 is provided to a decoder 14 which may also be implemented with PAL circuitry, for example, a PAL 20L10. The decoder 14 preferably comprises a BCD decoder and a one of three decoder and the counter 12 preferably comprises two BCD counters and a divide-by-three counter. In addition, the sink clock information is provided to a sink driver 16. The output of the decoder 14 is provided to source driver circuitry 18 which may include transistor source drivers. The output of the source driver circuitry and the sink driver 16 are provided to a multi-segment bargraph display 20, for example, the HDSP-88XX 101 element bargraph array. A more detailed schematic of the circuit of FIG. 1 is shown in FIG. 2 with like components labeled with the reference numerals.

Figure 2A:
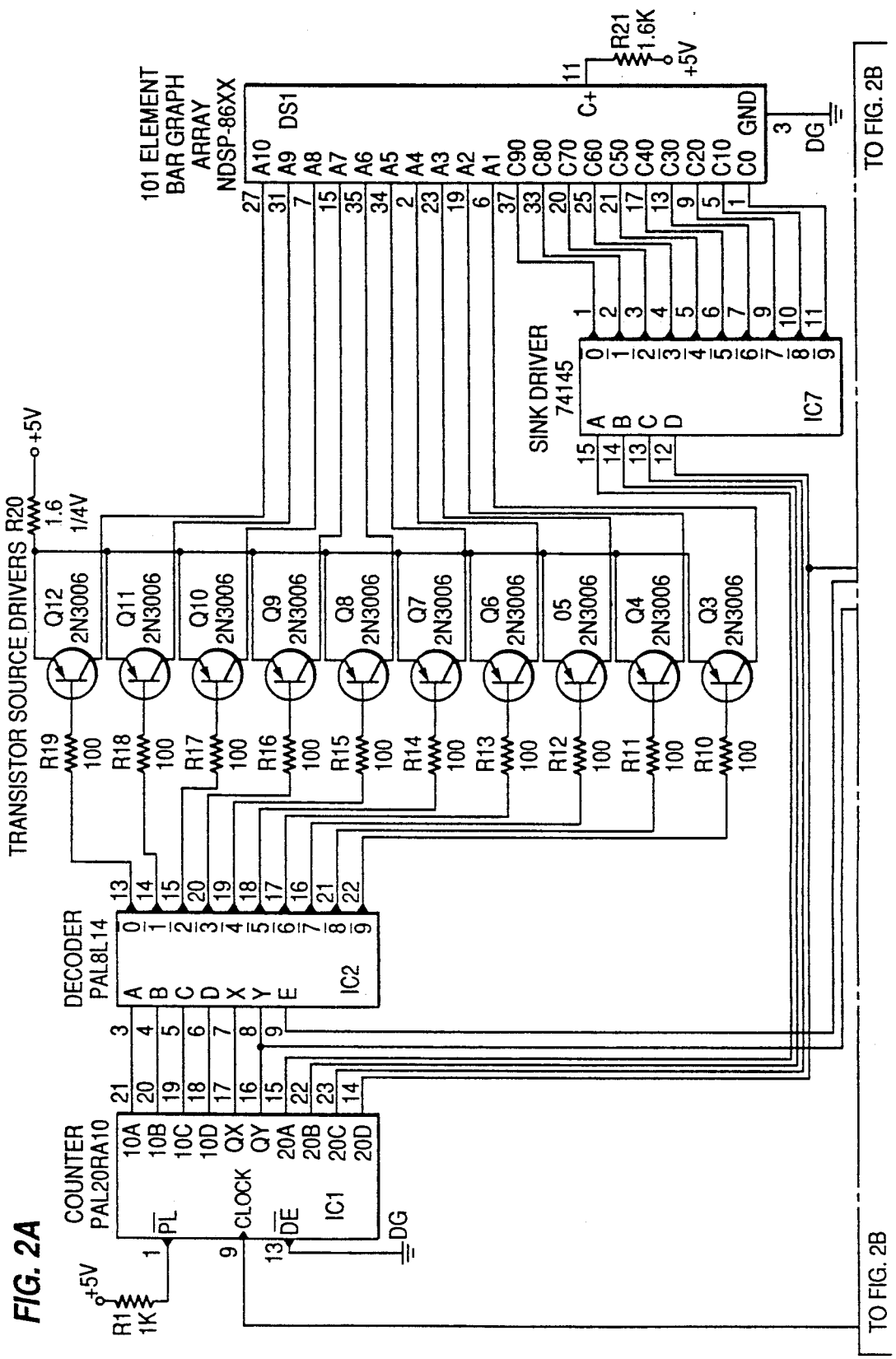
FIG. 2 is a schematic circuit diagram corresponding to the element shown in FIG. 1.
Figure 2B:
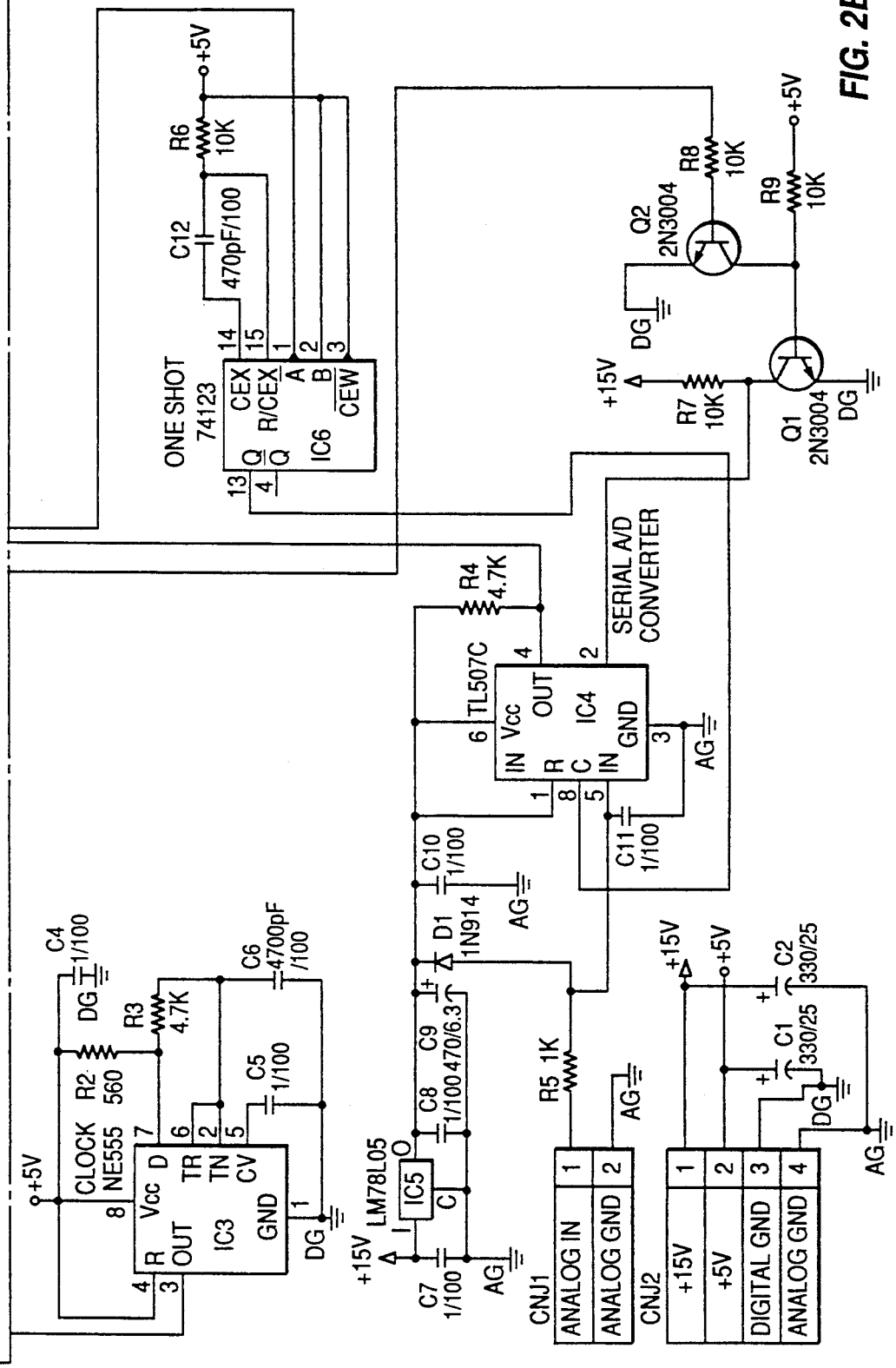

As shown in FIG. 2, the outputs 1QA-1QD of counter 12 comprise the source clock. Outputs QX and QY comprise the delay clock and outputs 2QA-2QD comprise the sink clock. The decoder 14 has a plurality of inputs including inputs A, B, C, D, X, Y and E. These inputs are further discussed in connection with the chart of FIG. 3 below.

The output of the decoder comprises outputs 0-9 which are supplied to the transistor source drivers of the source driver circuitry 18. The output of the transistor source drivers are provided to the display 20 along with the outputs of the sink driver 16. By using two sets of 0-9 inputs to access the 100 segments (10 groups × 10 elements), the number of lines needed to drive the display is reduced.

FIG. 3, a chart representing a counting/decoding sequence for the multi-segment array multiplexed display driver according to the present invention. As shown in this chart, there is a decoder input (counting sequence) which is indicated under the headings "DCBA". For example, in the first group of three lines DCBA are 0000 (corresponding to "0"). In the next three lines, DCBA are 0001 (corresponding to "1") and so on, down to 1001 (corresponding to "9").

The next column is entitled "Delay" and represents the state of the X and Y inputs to decoder 14 which represent the state of the delay clock of counter 12. For each group of three lines, the delay clock is 01, 00 and 10 respectively.

On the right side of the chart of FIG. 3 are the decoder outputs ("/0"–"/9"). For example, a "1" may represent an OFF-state or no display and a "0" may represent an ON-state or a display, but this invention is not so limited. When there are all 1's under the headings "/0"–"/9" (corresponding to ten segments of a display), this represents the completely off state such that none of segments "/0" to "/9" are driven and no display is provided. As shown by the first group of three lines in the chart, when X,Y corresponds to 0,1 respectively, the decoder outputs "0/"–"/9" are all 1's. Thus, the display is completely off. The second line (X, Y corresponding to 0,0) shows that the "/0" segment output is "0" which indicates that the segment is ON. The remaining segments ("/1"–"/9") however are "1" which indicates they are OFF. After the "/0" segment is displayed, X,Y changes to 1,0 and once again, segment /0–/9 of the decoder outputs are all 1's which represent a completely OFF state. For the next group of three lines (DCBA corresponding to 0001), X,Y assumes the value 0,1 and the segments are completely OFF. In the second line of this group, when X,Y is 00, decoder output segment "/1" assumes a "0" state which indicates a display for the "/1 segment," while the remaining decoder outputs ("/0" and "/2"–"/9") are all "1" indicating an OFF state. Then, when X,Y assume the 1,0 state, all segments of the decoder output are once again "1" and the display is completely OFF. The groups corresponding to DCBA values 0010–1001 operate in the same manner.

Therefore, it can be seen that there is at least one OFF-state associated with each ON-state of a display. In this way, ghost or phantom bars can be prevented. Preferably, for DCBA values other than 0000–1001, the decoder outputs /0–/9 are all 1's. In FIG. 3, the letter E represents an enable bit and its operation will be readily apparent to one of ordinary skill in the art.

Furthermore, by avoiding the use of a microprocessor, the need for shielding against the presence of RFI is avoided.

According to preferred embodiment of the present invention, the source clock corresponding to outputs 1QA–1QD of the counter 12 runs at a speed approximately ten times faster than the sink clock corresponding to outputs 2QA–2QD of the counter 12. In this way, the sink clock may be used to select one out of a group of ten displays and the source clock may be used to select the segment out of ten for the selected display.

In the embodiment discussed above, since in each display segment cycle there is an OFF-state an ON-state and then OFF-state, there is a 33 percent duty cycle. According to another embodiment of the invention, there could be an off-state and on-state another on-state and an off-state. If an increased duty cycle were desired this would be a preferred alternative to the first described embodiment. This alternate embodiment would produce approximately a 66 percent duty cycle.

Also, in the preferred embodiment discussed above, a count by three decoder is used. Instead of a count by three decoder, a count by four decoder may be used to achieve a 75 percent duty cycle.

The foregoing is a description of the preferred embodiments of the invention. However, the invention is not so limited. It will be obvious to one of ordinary skill in the art that various modifications can be made within the scope of the invention. The invention is only limited by the claims appended hereto.

I claim:

1. A display driver for a bar graph display comprising a multi-segment bar graph array, said driver comprising:
   counter means operable to generate a plurality of counter output signals;
   decoder means operatively connected to said counter means for receiving one or more of said plurality of counter output signals and generating a plurality of decoder output signals;
   sink driver means operatively connected to said counter means for receiving one or more of a plurality of said counter output signals and generating a plurality of sink driver output signals;
   source driver means operatively connected to said decoder for receiving one or more of said plurality of decoder output signals and generating a plurality of source driver output signals;
   wherein said plurality of source driver output signals and sink driver output signals are used to drive said bar graph display in a manner that each said segment that is switched to an ON-state is switched back to an OFF-state before another segment is switched to the ON-state, each said ON- and OFF-state having its respective separate period for application of the respective ones of said source and sink driver output signals before the period for said application thereof of the next one of said ON- and OFF-states.

2. The apparatus of claim 1, wherein for controlling an ON-state or OFF-state of any one or more selected ones of said multi-segment bar graph array:
   said sink driver output signals are during each said period are used to control one or more respective predetermined group of segments of said multi-segment bar graph array; and
   said source driver output signals during each said predetermined period are used to control one or more respective predetermined ones of said segments of said selected group of segments of said multi-segment bar graph array.

3. The apparatus of claim 2 wherein each said segment of the bar graph display is controlled to be in said OFF-state before and after each time it is in said ON-state.

4. The apparatus of claim 1 wherein the bar graph display is controlled to be in said OFF-state either before or after each time it is in said ON-state.

5. The apparatus of claim 1 wherein said decoder means comprises a count by three decoder.

6. The apparatus of claim 1 wherein said decoder means comprises a count by four decoder.

7. The apparatus of claim 6, wherein a duty cycle of 75 percent is achieved for said bar graph display as a result of said count by four decoder.

8. The apparatus of claim 1 wherein said counter means provides a source clock and a sink clock.

9. The apparatus of claim 8 wherein said source clock runs at a speed ten times faster than said sink clock.

10. The apparatus of claim 1 wherein said counter and decoder are implemented using PAL logic.

11. The apparatus of claim 1 wherein said driver circuitry is implemented substantially without a microprocessor to avoid the need to shield against radio frequency interference.

12. The apparatus of claim 1, wherein each said segment of said bar graph display that is switched to said ON-state is first switched to said OFF-state, then to said ON-state, and then to said OFF-state.

13. The apparatus of claim 12, wherein each said switching of a segment of said bar graph display to said ON-state during a respective period is followed by repeating the same ones of said source and sink driver signals during the subsequent period to keep said segment switched to said ON-state during the successive one of said predetermined periods, before said switching thereof to said OFF-state, whereby a duty cycle of 66 percent is achieved.

14. The apparatus of claim 12, wherein each said switching of said segment of said bar graph display from said OFF-state to said ON-state and then to said OFF-state occurs in three successive ones of said predetermined periods, wherein a duty cycle of each said segment so switched is approximately 33%.

15. The apparatus of claim 1, wherein each said segment of said bar graph display that is turned to said ON-state is first turned to said OFF-state, then to said ON-state for two of said predetermined periods, wherein a duty cycle of each said segment so switched is approximately 66%.

16. The apparatus of claim 1, wherein each said segment of said bar graph display that is turned to said ON-state is first turned to said OFF-state, then to said ON-state for two of said predetermined periods, and then to said OFF-state, in four respective successive one of said predetermined periods.

* * * * *